US009419240B2

(12) United States Patent
Lee et al.

(10) Patent No.: US 9,419,240 B2
(45) Date of Patent: Aug. 16, 2016

(54) ORGANIC LIGHT EMITTING TRANSISTOR AND DISPLAY DEVICE HAVING THE SAME

(71) Applicant: SAMSUNG DISPLAY CO., LTD., Yongin, Gyeonggi-Do (KR)

(72) Inventors: Seungchan Lee, Suwon-si (KR); Kiseo Kim, Gongju-si (KR); Sungkook Park, Suwon-si (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

(21) Appl. No.: 14/700,293

(22) Filed: Apr. 30, 2015

(65) Prior Publication Data
US 2016/0155980 A1   Jun. 2, 2016

(30) Foreign Application Priority Data
Dec. 2, 2014 (KR) .................. 10-2014-0170690

(51) Int. Cl.
*H01L 51/52* (2006.01)
*H01L 51/50* (2006.01)

(52) U.S. Cl.
CPC ........ *H01L 51/5203* (2013.01); *H01L 51/5068* (2013.01); *H01L 51/5084* (2013.01); *H01L 51/5296* (2013.01); *H01L 2251/5307* (2013.01)

(58) Field of Classification Search
CPC .................................................. H01L 51/5203
See application file for complete search history.

(56) References Cited

U.S. PATENT DOCUMENTS

| 5,952,680 A | 9/1999 | Strite | |
| 7,382,040 B2* | 6/2008 | Harada | H01L 51/0512 257/401 |
| 7,868,319 B2* | 1/2011 | Adachi | H01L 27/3234 257/40 |

(Continued)

FOREIGN PATENT DOCUMENTS

| KR | 10-2008-0093038 A | 10/2008 |
| KR | 10-2013-0095909 A | 8/2013 |

(Continued)

OTHER PUBLICATIONS

Nakamura, Improvedment of Metal-Insulator-Semiconductor-Typer Organic Light-Emitting Transistors, Japanese Journal of Applied Physics, vol. 47, No. 3, 2008, pp. 1889-1893.

*Primary Examiner* — Lex Malsawma
(74) *Attorney, Agent, or Firm* — Lee & Morse, P.C.

(57) ABSTRACT

An organic light emitting transistor includes a substrate, a first insulating layer on the substrate, an auxiliary gate electrode between the substrate and the first insulating layer, the auxiliary gate electrode corresponding to a first area, a switching gate electrode between the substrate and the first insulating layer, the switching gate electrode corresponding to a second area defined adjacent to at least one side of the first area, the switching gate electrode being insulated from the auxiliary gate electrode, a source electrode on the first insulating layer, the source electrode corresponding to the second area, a semiconductor layer on the first insulating layer, the semiconductor layer corresponding to at least the first area and the semiconductor layer being connected to the source electrode, a drain electrode corresponding to at least the first area, and a light emitting layer interposed between the drain electrode and the semiconductor layer.

15 Claims, 13 Drawing Sheets

(56) References Cited

U.S. PATENT DOCUMENTS

| | | | |
|---|---|---|---|
| 2005/0263756 A1* | 12/2005 | Yatsunami | H01L 51/0021 257/40 |
| 2006/0275964 A1 | 12/2006 | Noda | |
| 2009/0179195 A1* | 7/2009 | Obata | H01L 51/0541 257/40 |
| 2009/0224233 A1* | 9/2009 | Obata | H01L 51/5296 257/40 |
| 2009/0315043 A1* | 12/2009 | Nakamura | H01L 51/0545 257/88 |
| 2010/0090202 A1* | 4/2010 | Obata | H01L 51/002 257/40 |
| 2013/0161765 A1 | 6/2013 | Sonoyama et al. | |
| 2014/0117317 A1* | 5/2014 | Kim | H01L 51/5296 257/40 |
| 2014/0124759 A1* | 5/2014 | Mok | H01L 51/5296 257/40 |

FOREIGN PATENT DOCUMENTS

| | | |
|---|---|---|
| KR | 10-2014-0019698 A | 2/2014 |
| KR | 10-2014-0055142 A | 5/2014 |
| KR | 10-2014-0058752 A | 5/2014 |

* cited by examiner

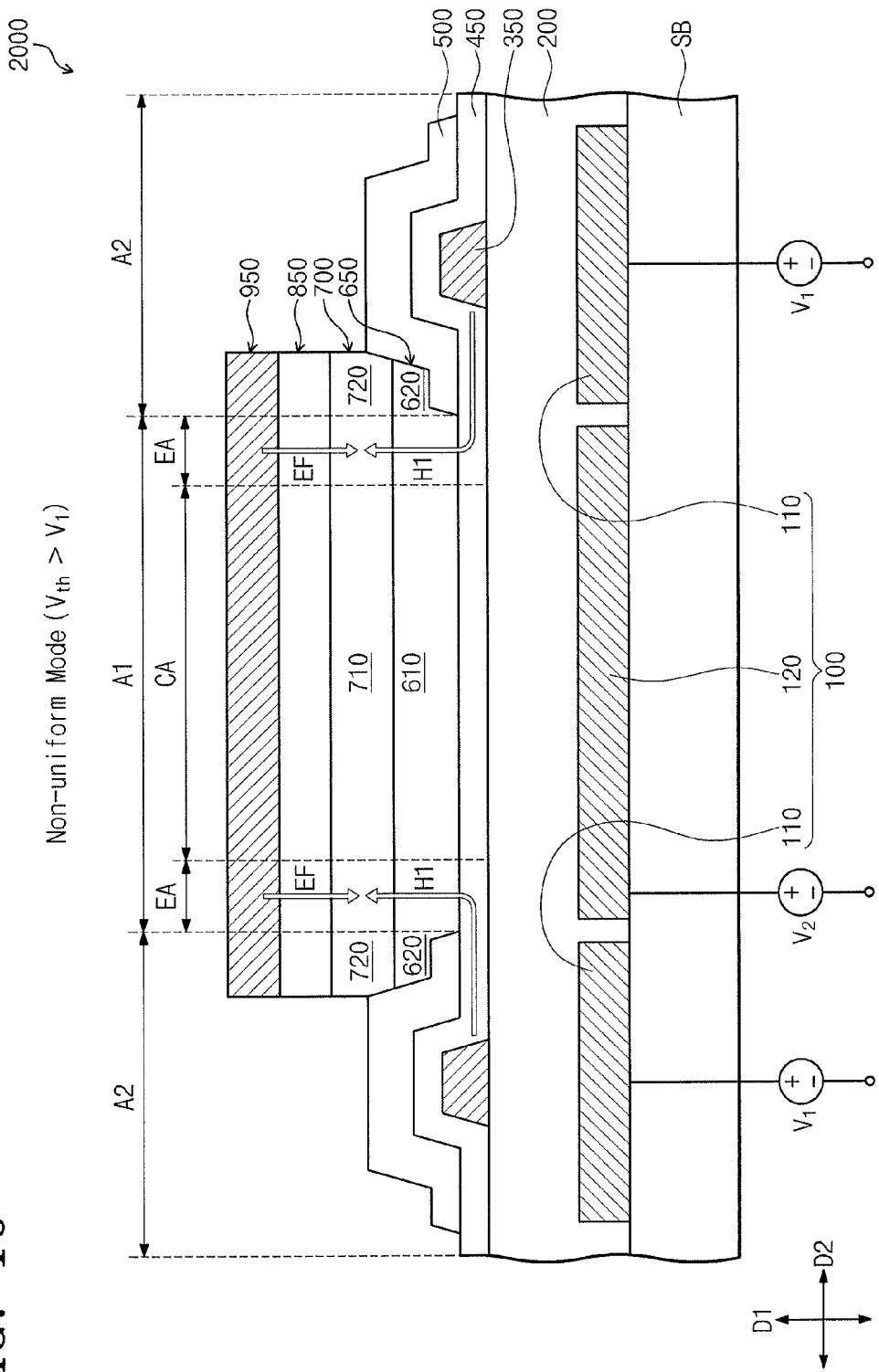

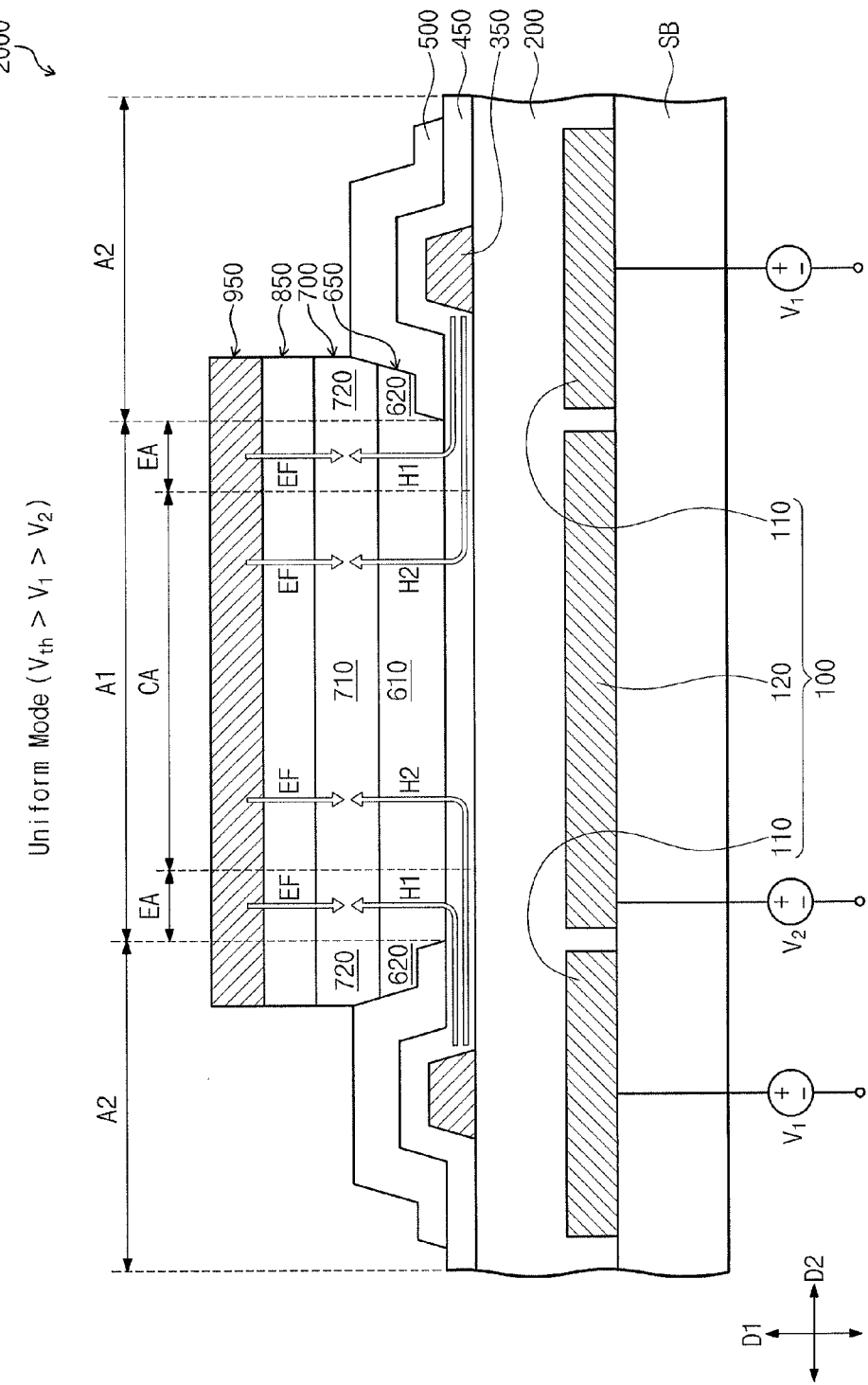

ORGANIC LIGHT EMITTING TRANSISTOR AND DISPLAY DEVICE HAVING THE SAME

CROSS-REFERENCE TO RELATED APPLICATION

Korean Patent Application No. 10-2014-0170690, filed on Dec. 2, 2014, in the Korean Intellectual Property Office, and entitled: "Organic Light Emitting Transistor and Display Device Having the Same," is incorporated by reference herein in its entirety.

BACKGROUND

1. Field

Embodiments relate to an organic light emitting transistor and a display device having the organic light emitting transistor.

2. Description of the Related Art

A flat panel display device is classified into a light-emitting type and a light-receiving type. As the light-emitting type flat panel display device, a flat cathode ray tube, a plasma display panel, and an organic light emitting display are widely used. The organic light emitting display is a self-emissive type display and has various advantages, such as a wide viewing angle, a superior contrast, a fast response time, etc.

The organic light emitting display may be applied to various displays for mobile devices, e.g., a digital camera, a video camera, a camcorder, a mobile information terminal, a smart phone, an ultra slim notebook, a tablet personal computer, a flexible display device, etc., or large-size electronic/electric products. e.g., an ultra-thin TV set.

In the organic light emitting display, holes and electrons are injected into an organic light emitting layer and recombined in the organic light emitting layer to generate excitons. The organic light emitting display emits light when the excitons return to a ground state from an excited state.

SUMMARY

Embodiments are directed to an organic light emitting transistor including a substrate, a first insulating layer on the substrate, an auxiliary gate electrode between the substrate and the first insulating layer, the auxiliary gate electrode corresponding to a first area, a switching gate electrode between the substrate and the first insulating layer, the switching gate electrode corresponding to a second area defined adjacent to at least one side of the first area, the switching gate electrode being insulated from the auxiliary gate electrode, a source electrode on the first insulating layer, the source electrode corresponding to the second area, a semiconductor layer on the first insulating layer, the semiconductor layer corresponding to at least the first area and the semiconductor layer being connected to the source electrode, a drain electrode corresponding to at least the first area, and a light emitting layer interposed between the drain electrode and the semiconductor layer.

The organic light emitting transistor may further include a second insulating layer. The light emitting layer may include a first portion corresponding to the first area and a second portion extending from the first portion and corresponding to the second area. The second insulating layer may be between the second portion and the source electrode, the second insulating layer corresponding to the second area and insulating the first portion from the source electrode.

The second area may surround the first area. The switching gate electrode may surround the auxiliary gate electrode.

The second area may include a first sub-area and a second sub-area that are spaced apart from each other in a direction substantially vertical to a thickness direction of the substrate. The switching gate electrode may include a first sub-switching gate electrode provided in the first sub-area and a second sub-switching gate electrode provided in the second sub-area. The first area may be between the first and second sub-areas. The auxiliary gate electrode may be between the first and second sub-switching gate electrodes.

The source electrode may be spaced apart from the first area by a distance along a direction substantially vertical to a thickness direction of the substrate. The distance may be in a range from about 0.5 micrometers to about 10 micrometers.

The semiconductor layer may include an n-type semiconductor material. An electron transport area may be between the semiconductor layer and the light emitting layer. A hole transport area may be between the semiconductor layer and the drain electrode.

The semiconductor layer may include a p-type semiconductor material. A hole transport area may be between the semiconductor layer and the light emitting layer. An electron transport area may be between the semiconductor layer and the drain electrode.

Embodiments are also directed to a display device including an organic light emitting transistor and a driver controlling the organic light emitting transistor. The organic light emitting transistor includes a substrate, a first insulating layer on the substrate, an auxiliary gate electrode between the substrate and the first insulating layer, the auxiliary gate electrode corresponding to a first area, a switching gate electrode between the substrate and the first insulating layer, the switching gate electrode corresponding to a second area defined adjacent to at least one side of the first area and the switching gate electrode being insulated from the auxiliary gate electrode, a source electrode on the first insulating layer, the source electrode corresponding to the second area, a semiconductor layer on the first insulating layer, the semiconductor layer corresponding to at least the first area and the semiconductor layer being connected to the source electrode, a drain electrode corresponding to at least the first area, and a light emitting layer between the drain electrode and the semiconductor layer. The driver applies an auxiliary voltage to the auxiliary gate electrode and applies a switching voltage different from the auxiliary voltage to the switching gate electrode to minimize a difference in brightness between a first light generated in a center portion of the first area and a second light generated in an edge portion of the first area.

The auxiliary voltage may have an electric potential higher than an electric potential of the switching voltage. The semiconductor layer may include an n-type semiconductor material. An electron transport area may be between the semiconductor layer and the light emitting layer. A hole transport area is between the semiconductor layer and the drain electrode.

The auxiliary voltage may have an electric potential lower than an electric potential of the switching voltage. The semiconductor layer includes an p-type semiconductor material. A hole transport area may be between the semiconductor layer and the light emitting layer. An electron transport area may be between the semiconductor layer and the drain electrode.

BRIEF DESCRIPTION OF THE DRAWINGS

Features will become apparent to those of skill in the art by describing in detail exemplary embodiments with reference to the attached drawings in which:

FIG. 10 illustrates a cross-sectional view showing a non-uniform mode of the organic light emitting transistor shown in FIG. 9; and FIG. 11 illustrates a cross-sectional view showing an operation of a uniform mode of the organic light emitting transistor shown in FIG. 9.

DETAILED DESCRIPTION

Figure 1:
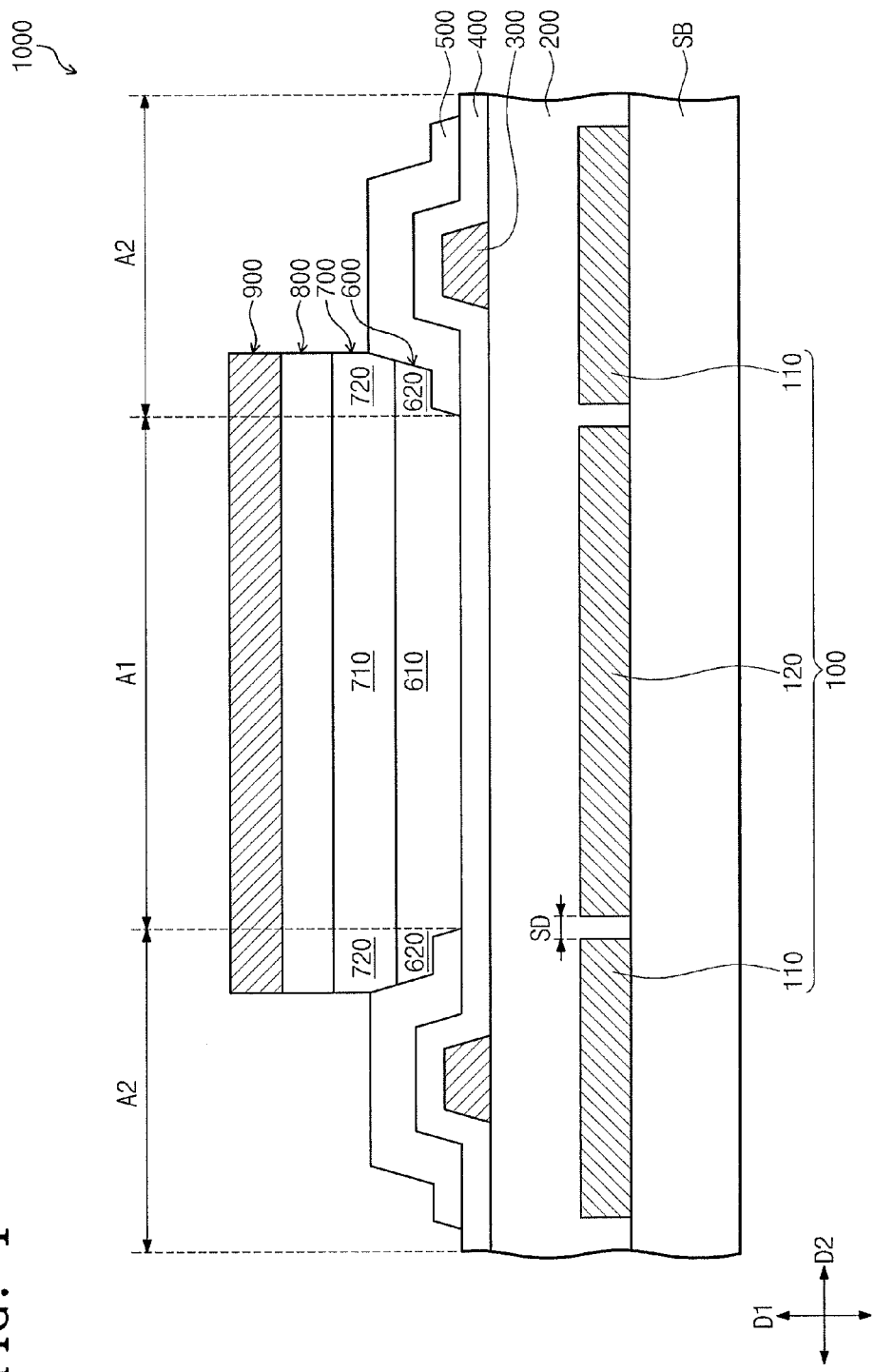
FIG. 1 illustrates a cross-sectional view showing an organic light emitting transistor according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "between" two layers, it can be the only layer between the two layers, or one or more intervening layers may also be present. Like reference numerals refer to like elements throughout.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings thereof.

Unless otherwise defined, all terms (including technical and scientific terms) used herein have the same meaning as commonly understood by one of ordinary skill in the relevant art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a cross-sectional view showing an organic light emitting transistor 1000 according to an exemplary embodiment.

Referring to FIG. 1, the organic light emitting transistor 1000 may include a substrate SB, a gate electrode 100, a first insulating layer 200, a source electrode 300, a semiconductor layer 400, a second insulating layer 500, a first transport area 600, a light emitting layer 700, a second transport area 800, and a drain electrode 900.

The gate electrode 100 may be disposed on the substrate SB. The gate electrode 100 may include a switching gate electrode 110 and an auxiliary gate electrode 120. The switching gate electrode 110 and the auxiliary gate electrode 120 may be insulated from each other. The switching gate electrode 110 and the auxiliary gate electrode 120 may be applied with different voltages from each other.

The gate electrode 100 may include a conductive material. The gate electrode 100 may be a reflective electrode, a transflective electrode, or a transmissive electrode.

A first area A1 and a second area A2 are defined on the substrate SB. The first area A1 may be a light emitting area through which a light generated by the organic light emitting transistor 1000 is emitted. The second area A2 may be a non-light emitting area. As an example, the second area A2 may include a left side second area and a right side second area. The first area A1 may be interposed between the left side second area and the right side second area.

The auxiliary gate electrode 120 may be disposed on the substrate SB to correspond to the first area A1. The switching gate electrode 110 is disposed on the substrate SB to correspond to the second area A2. Herein, unless otherwise indicated, the terms "correspond to" as in "correspond to the first area A1" or "correspond to the second area A2" may have the same meaning as "located within" or "located entirely within." For example, the switching gate electrode 110 and the auxiliary gate electrode 120 may be spaced apart from each other in a second direction D2 by a gate distance SD. Herein, a thickness direction of the substrate SB is referred to as a first direction D1, and the second direction D2 is substantially perpendicular to the first direction D1. The gate distance GD may be in a range from about 0.1 micrometers to about 10 micrometers. As an example, the gate distance GD may have a minimum value in a limited resolution range of a process of forming the gate electrode 100.

The first insulating layer 200 may be disposed over an entire surface of the substrate SB. The first insulating layer 200 may cover the substrate SB and the gate electrode 100. The first insulating layer 200 may insulate the gate electrode 100 from the source electrode 300. The first insulating layer 200 may insulate the gate electrode 100 from the semiconductor layer 400. The first insulating layer 200 may serve as a planarization layer.

The first insulating layer 200 may include an inorganic material. As examples, the first insulating layer 200 may include at least one of silicon nitride ($SiN_x$), silicon oxide ($SiO_x$), and aluminum oxide ($Al_xO_y$). In some implementations, the first insulating layer 200 may include an organic material, e.g., polystyrene, polymethyl methacrylate, etc.

The source electrode 300 may be disposed on the first insulating layer 200 to correspond to the second area A2. The source electrode 300 may be insulated from the gate electrode 100 by the first insulating layer 200. In addition, the source electrode 300 may be spaced apart from the first area A1 in the second direction D2 by a distance in a range from about 0.5 micrometers to about 10 micrometers.

The source electrode 300 may be a negative electrode. The source electrode 300 may be a transmission electrode, a transflective electrode, or a reflective electrode. When the source electrode 300 is the transmission electrode, the source electrode 300 may include Li, Ca, LiF/Ca, LiF/Al, Al, Mg, BaF, Ba, Ag, or a compound or a mixture thereof, e.g., a mixture of Ag and Mg.

The source electrode 300 may include an auxiliary electrode. The auxiliary electrode may include a layer formed by depositing a material at a portion of the source electrode 300 facing the light emitting layer and a transparent metal oxide disposed on the layer, e.g., indium tin oxide (ITO), indium zinc oxide (IZO), zinc oxide (ZnO), indium tin zinc oxide (ITZO), Mo, Ti, etc.

When the source electrode 300 is a transflective electrode or a reflective electrode, the source electrode 300 may include Ag, Mg, Al, Pt, Pd, Au, Ni, Nd, Ir, Cr, Li, Ca, LiF/Ca, LiF/Al, Mo, Ti, or a compound or mixture thereof, e.g., a mixture of Ag and Mg. The source electrode 300 may have a multi-layer structure including a reflective or transflective layer of the above-described material and a transparent conductive layer of ITO, IZO, ZnO, ITZO, etc.

When the organic light emitting transistor is a front surface light emitting type, the gate electrode 100 may be a reflective electrode, and the source electrode 300 may be a transmission electrode or a transflective electrode. When the organic light emitting transistor is a rear surface light emitting type, the gate electrode 100 is a transmission electrode or a transflective electrode, and the source electrode 300 is the reflective electrode.

The semiconductor layer 400 may be disposed over an entire surface of the first insulating layer 200. The semiconductor layer 400 may cover the source electrode 300 and the first insulating layer 200. The semiconductor layer 400 may contact and be electrically connected to the source electrode 300. In addition, the semiconductor layer 400 may contact and be electrically connected to the first transport area 600.

The semiconductor layer 400 may include amorphous silicon, crystalline silicon, or metal oxide semiconductor. The semiconductor layer 400 may include an organic semiconductor material. The semiconductor layer 400 may include one of an n-type semiconductor material and a p-type semiconductor material. Hereinafter, the semiconductor layer 400 including the n-type semiconductor material will be described in detail as a representative example.

The first transport area 600 may be disposed on the semiconductor layer 400 to correspond to at least the first area A1. Herein, unless otherwise indicated, the term "correspond at least to" indicates that the layer or element referred to may also at least partially overlap an adjoining area. As an example, the first transport area 600 may include a first portion 610 provided in the first area A1 and a second portion 620 extending from the first portion 610 and provided in the second area A2.

The first transport area 600 may be, for example, an electron transport area. The electron transport area may include one of a hole block layer, an electron transport layer ETL, and an electron injection layer, as examples.

For instance, the electron transport area may have a structure of the electron injection layer/the electron transport layer or the electron injection layer/the electron transport layer/the hole block layer, which are sequentially stacked on the semiconductor layer 400. In some implementations, the electron transport area may have a single-layer structure configured to include two or more layers of the above-mentioned layers.

The electron transport area may be formed by a suitable method, such as a vacuum deposition method, a spin coating method, a casting method, a Langmuir-Blodgett (LB), an inkjet printing method, a laser printing method, a laser induced thermal imaging (LITI), etc.

When the electron transport area includes the electron transport layer, the electron transport area may include Alq3 (Tris(8-hydroxyquinolinato)aluminum), TPBi (1,3,5-Tri(1-phenyl-1H-benzo[d]imidazol-2-yl)phenyl), BCP (2,9-dimethyl-4,7-diphenyl-1,10-phenanthroline), Bphen (4,7-diphenyl-1,10-phenanthroline), TAZ (3-(4-biphenylyl)-4-phenyl-5-tert-butylphenyl-1,2,4-triazole), NTAZ (4-(naphthalen-1-yl)-3,5-diphenyl-4H-1,2,4-triazole), tBu-PBD (2-(4-biphenylyl)-5-(4-tert-butylphenyl)-1,3,4-oxadiazole), BAlq (bis(2-methyl-8-quinolinolato-N1,O8)-(1,1'-biphenyl-4-olato)aluminum), Bebq2 (beryllium bis(benzoquinolin-10-olate)), ADN (9,10-di(naphthalene-2-yl)anthracene), or a mixture thereof. The electron transport layer may have a thickness of about 100 angstroms to about 1000 angstroms, or, for example, about 150 angstroms to about 500 angstroms. When the thickness of the electron transport layer is in the above-mentioned range, superior electron transport characteristics may be obtained without increasing a driving voltage.

When the electron transport area includes the electron injection layer, the electron transport area may include a lanthanum-group metal, e.g., LiF, LiQ (lithium quinolate), $Li_2O$, BaO, NaCl, CsF, Yb, etc., or a halide metal, e.g., RbCl, Rbl, etc. The electron injection layer may include a material obtained by mixing an electron transport material with an organo metal salt having insulating property. The organo metal salt may have an energy band gap of about 4 ev. For example, the organo metal salt may include metal acetate, metal benzoate, metal acetoacetate, metal acetylacetonate, or metal stearate. The electron injection layer may have a thickness of about 1 angstroms to about 100 angstroms, or, for example, about 3 angstroms to about 90 angstroms. When the thickness of the electron injection layer is in the above-mentioned range, superior electron injection characteristics may be obtained without increasing the driving voltage.

As described above, the electron transport area may includes the hole block layer. The hole block layer may include at least one of BCP (2,9-dimethyl-4,7-diphenyl-1,10-phenanthroline) and Bphen (4,7-diphenyl-1,10-phenanthroline), as examples. The hole block layer may have a thickness of about 20 angstroms to about 1000 angstroms, or, for example, about 30 angstroms to about 300 angstroms. When the thickness of the hole block layer is in the above-mentioned range, superior hole block characteristics may be obtained without increasing the driving voltage.

The light emitting layer 700 may be disposed on the first transport area 600 to correspond to at least the first area A1. As an example, the light emitting layer 700 may include a first portion 710 of the light emitting layer 700 provided in the first area A1 and a second portion 720 of the light emitting layer 700 extending from the first portion 710 and provided in the second area A2.

The light emitting layer 700 may have a single-layer structure of a single material, a single-layer structure including different materials from each other, or a multi-layer structure of different materials from each other.

The light emitting layer 700 may be formed by a suitable method, such as a vacuum deposition method, a spin coating method, a casting method, a Langmuir-Blodgett (LB), an inkjet printing method, a laser printing method, a laser induced thermal imaging (LITI), etc.

The light emitting layer 700 may include materials emitting red, green, and blue color light. The light emitting layer 700 may include a fluorescent material or a phosphorescent material. The light emitting layer 700 includes a host and a dopant.

As the host, for example, Alq3 (tris(8-hydroxyquinolino) aluminum), CBP (4,4'-bis(N-carbazolyl)-1,1'-biphenyl), PVK (poly(n-vinylcarbazole)), ADN (9,10-di(naphthalene-2-yl)anthracene), TCTA (4,4',4"-Tris(carbazol-9-yl)-triphenylamine), TPBi (1,3,5-tris(N-phenylbenzimidazole-2-yl) benzene), TBADN (3-tert-butyl-9,10-di(naphth-2-yl) anthracene), DSA (distyrylarylene), CDBP (4,4'-bis(9-carbazolyl)-2,2'-dimethyl-biphenyl), MADN (2-methyl-9,10-bis(naphthalen-2-yl)anthracene) may be used.

When the light emitting layer 700 emits the red color light, the light emitting layer 700 may include a fluorescent material containing PBD:Eu(DBM)$_3$(Phen) (tris(dibenzoylmethanato)phenanthroline europium) or perylene. When the light emitting layer 700 emits the red color light, the dopant included in the light emitting layer 700 may be selected from a metal complex, such as PIQIr(acac) (bis(1-phenylisoquinoline)acetylacetonate iridium), PQIr(acac) (bis(1-phenylquinoline) acetylacetonate iridium), PQIr (tris(1-phenylquinoline)iridium). PtOEP (octaethylporphyrin platinum), etc., or another suitable organometallic complex.

When the light emitting layer 700 emits a green color light, the light emitting layer 700 may include a fluorescent material containing Alq3 (tris(8-hydroxyquinolino)aluminum). When the light emitting layer 700 emits the green color light, the dopant included in the light emitting layer 700 may be selected from a metal complex such as Ir(ppy)$_3$ (fac-tris(2-phenylpyridine)iridium) or another suitable organometallic complex.

When the light emitting layer 700 emits a blue color light, the light emitting layer 700 may include a fluorescent material containing one selected from spiro-DPVBi, spiro-6P, distyryl-benzene (DSB), distyryl-arylene (DSA), a polyfluorene-based polymer, and a poly(p-phenylene vinylene)-based polymer. When the light emitting layer 700 emits the blue color light, the dopant included in the light emitting layer 700 may be selected from an metal complex such as (4,6-F2ppy)$_2$ Irpic or another suitable organometallic complex.

The second transport area 800 may be disposed on the light emitting layer 700 to correspond to at least the first area A1. The second transport area 800 may be, for example, a hole transport area.

The hole transport area may include at least one of a hole injection layer, a hole transport layer, a buffer layer, and an electron block layer.

The hole transport area may have a single-layer structure of a single material, a single-layer structure including different materials from each other, or a multi-layer structure of different materials from each other.

For instance, the hole transport area may have the single-layer structure of different materials from each other. In other implementations, the hole transport area may have a structure of the hole transport layer/the hole injection layer, the buffer layer/the hole transport layer/the hole injection layer, the buffer layer/the hole injection layer, the buffer layer/the hole transport layer, or the electron block layer/the hole transport layer/the hole injection layer.

The hole transport area may be formed by a suitable method, such as a vacuum deposition method, a spin coating method, a casting method, a Langmuir-Blodgett (LB), an inkjet printing method, a laser printing method, a laser induced thermal imaging (LITI), etc.

When the hole transport area includes the hole injection layer, the hole transport area may include a phthalocyanine compound of copper phthalocyanine; DNTPD (N,N-diphenyl-N,N'-bis-[4-(phenyl-m-tolyl-amino)-phenyl]-biphenyl-4,4'-diamine), m-MTDATA (4,4',4"-tris(3-methylphenylphenylamino) triphenylamine), TDATA (4,4'4"-Tris(N,N-diphenylamino)triphenylamine), 2TNATA (4,4',4"-tris{N-(2-naphthyl)-N-phenylamino}-triphenylamine), PEDOT/PSS (Poly(3,4-ethylenedioxythiophene)/Poly(4-styrenesulfonate)), PANI/DBSA (Polyaniline/Dodecylbenzenesulfonic acid), PANI/CSA (Polyaniline/Camphor sulfonic acid), PANI/PSS ((Polyaniline)/Poly(4-styrenesulfonate)), as examples.

When the hole transport area includes the hole transport layer, the hole transport area may include a carbazole-based derivative, such as N-phenyl carbazole, polyvinyl carbazole, etc., a fluorine-based derivative, a triphenylamine-based derivative, such as TPD (N,N'-bis(3-methylphenyl)-N,N'-diphenyl-[1,1-biphenyl]-4,4'-diamine), TCTA (4,4',4"-tris (N-carbazolyl)triphenylamine), etc., NPB (N,N'-di(1-naphthyl)-N,N'-diphenylbenzidine), or TAPC (4,4'-Cyclohexylidene bis[N,N-bis(4-methylphenyl) benzenamine]), as examples.

The hole transport area may have a thickness of about 100 angstroms to about 10,000 angstroms, or, for example, about 100 angstroms to about 1,000 angstroms. When the hole transport area includes the hole injection layer and the hole transport layer, the hole injection layer has a thickness of about 100 angstroms to about 10,000 angstroms, or, for example, about 100 angstroms to about 1,000 angstroms, and the hole transport layer may have a thickness of about 50 angstroms to about 2,000 angstroms, or, for example, about 100 angstroms to about 1,500 angstroms. When the thicknesses of the hole transport area, the hole injection layer, and the hole transport layer are in the above-mentioned ranges, superior hole transport characteristics may be obtained without increasing the driving voltage.

The hole transport area may further include an electric charge generating material to improve the conductivity thereof. The electric charge generating material may be regularly or irregularly dispersed in the hole transport area. For instance, the electric charge generating material may be a p-dopant. The p-dopant may be a quinone derivative, a metal oxide, or a cyano group-containing compound, as examples. For example, the p-dopant may include a quinone derivative such as TCNQ (tetracyanoquinodimethane), F4-TCNQ (2,3, 5,6-tetrafluoro-tetracyanoquinodimethane), etc., or a metal oxide such as tungsten oxide, molybdenum oxide, etc.

As described above, the hole transport area may further include at least one of the buffer layer and the electron block layer in addition to the hole injection layer and the hole transport layer. The buffer layer may compensate for a resonance distance according to a wavelength of the light exiting from the light emitting layer to enhance the light emission efficiency of the light emitting layer. The material included in the hole transport area may be included in the buffer layer. The electron block layer may prevent electrons from being injected to the hole transport area from the electron transport area.

The drain electrode 900 may be disposed on the second transport area 800 to correspond to the first area A1. The drain electrode 900 may be a pixel electrode or a positive electrode. The drain electrode 900 may be a transmissive electrode, the transflective electrode, or the reflective electrode.

When the drain electrode 900 is a transmissive electrode, the drain electrode 900 may include a transparent metal oxide, e.g., ITO, IZO, ZnO, ITZO, etc. When the drain electrode 900 is a transflective electrode or the reflective electrode, the drain electrode 900 may include Ag, Mg, Al, Pt, Pd, Au, Ni, Nd, Ir, Cr, or a metal mixture.

The drain electrode 900 may have a single-layer structure of the transparent metal oxide or metal or a multi-layer structure of plural layers. For instance, the drain electrode 900 may have a single-layer structure of ITO, Ag, or a metal mixture, e.g., a mixture of Ag and Mg), a double-layer structure of ITO/Mg or ITO/MgF, or a triple-layer structure of ITO/Ag/ITO.

In FIG. 1, the first transport area 600, the light emitting layer 700, the second transport area 800, and the drain electrode 900 are formed in the first area A1 and the second area A2 adjacent to the first area A1. In other implementations, the first transport area 600, the light emitting layer 700, the second transport area 800, and the drain electrode 900 may be provided on the entire surface of the substrate SB. In this case, the first transport area 600, the light emitting layer 700, the second transport area 800, and the drain electrode 900 may cover the second insulating layer 500 and the semiconductor layer 400.

The second insulating layer 500 may be provided to correspond to the second area A2. The second insulating layer 500 may insulate portions of the first transport area 600, the light emitting layer 700, the second transport area 800, and the drain electrode 900, which are provided in the second area A2, from the source electrode 300.

For example, the second insulating layer 500 may be interposed between the light emitting layer 700 and the source electrode 300 to insulate the first portion 710 of the light emitting layer 700 from the source electrode 300. Similarly, the second insulating layer 500 may be interposed between the first transport area 600 and the source electrode 300 to insulate the second portion 620 of the first transport area 600 from the source electrode 300.

The second insulating layer 500 may include at least one of silicon nitride ($SiN_x$), silicon oxide ($SiO_x$), and aluminum oxide ($Al_xO_y$), as examples. In some implementations, the first insulating layer 200 may include an organic material, e.g., polystyrene, polymethyl methacrylate, etc.

In the present exemplary embodiment, the semiconductor layer 400 may include an n-type semiconductor material. In this case, the source electrode 300 may be a negative electrode and the drain electrode 900 may be a positive electrode. Electrons injected from the source electrode 300 may reach the light emitting layer 700 through the first transport area 600. Holes injected from the drain electrode 900 may reach the light emitting layer 700 through the second transport area 800. The electrons and holes injected respectively through the first and second transport areas 600 and 800 may recombine in the light emitting layer 700 to generate light.

Figure 2:
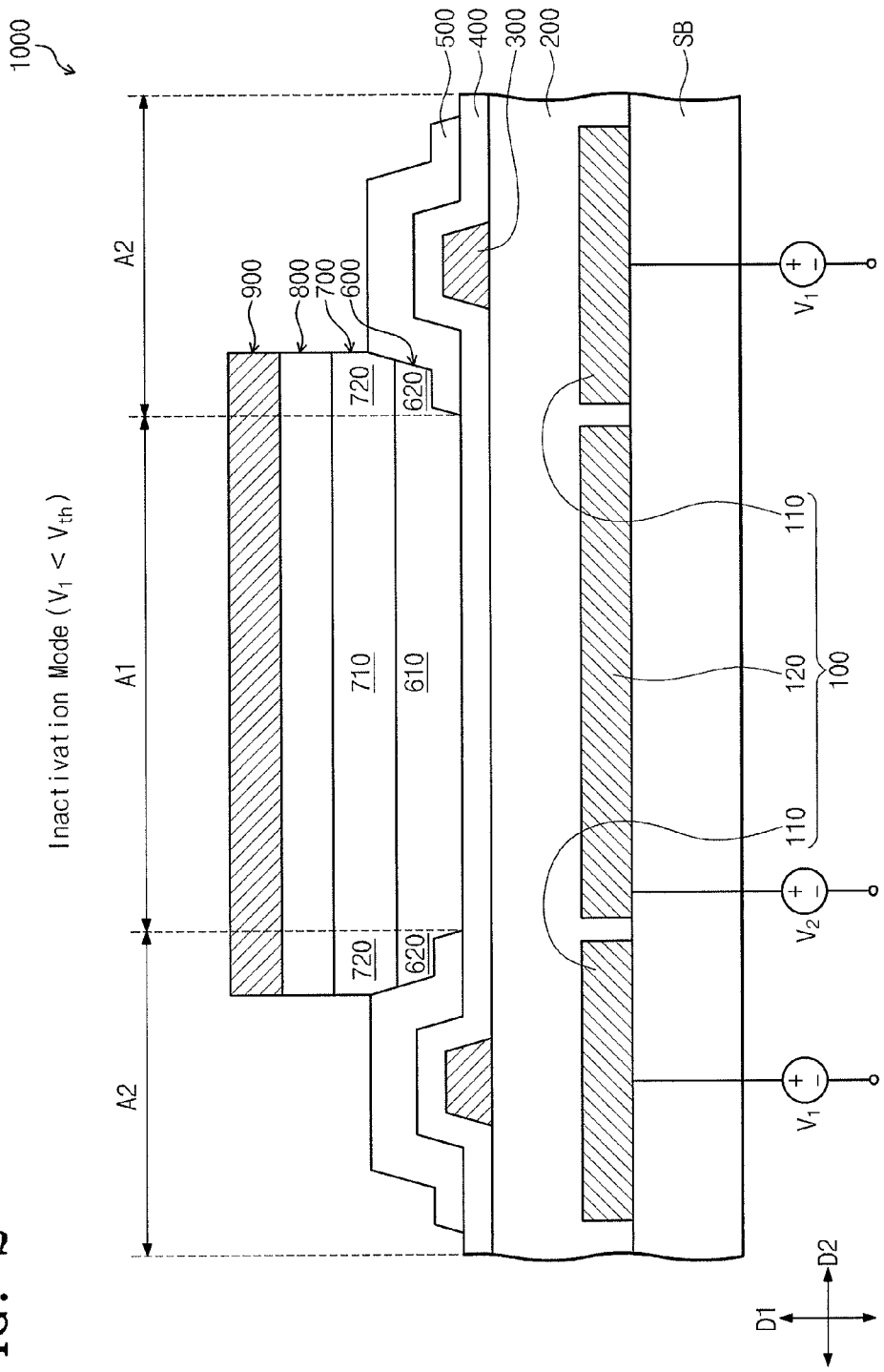
FIG. 2 illustrates a cross-sectional view showing an operation of an inactivation mode according to an exemplary embodiment.

FIG. 2 illustrates a cross-sectional view showing an operation of an inactivation mode according to an exemplary embodiment.

Referring to FIG. 2, a switching voltage V1 may be applied to the switching gate electrode 110 and an auxiliary voltage V2 is applied to the auxiliary gate electrode 120. In the inactivation mode, the switching voltage V1 is smaller than a threshold voltage Vth that forms an n-channel in the semiconductor layer 400.

Accordingly, the channel is not formed in the semiconductor layer 400 disposed in the second area A2, and thus, the electrons provided from the source electrode 300 may not move to the first transport area 600 through the semiconductor layer 400 even though the driving voltage is applied to the source electrode 300 and the drain electrode 900. As a result, the organic light emitting transistor 1000 does not emit light regardless of an electric potential of the auxiliary voltage V2.

Figure 3A:
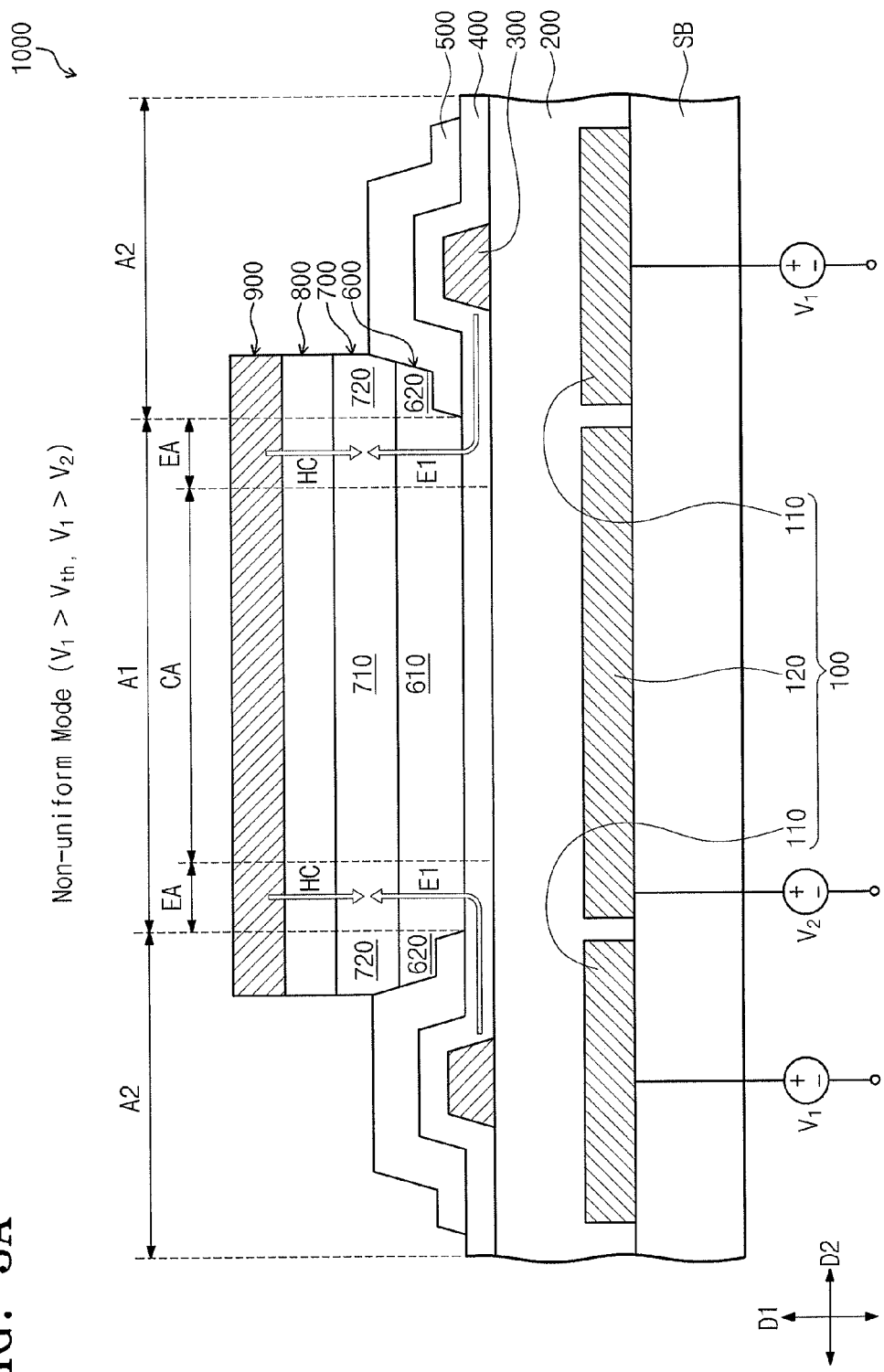
FIG. 3A illustrates a cross-sectional view showing an operation of a non-uniform mode according to an exemplary embodiment.
Figure 3B:
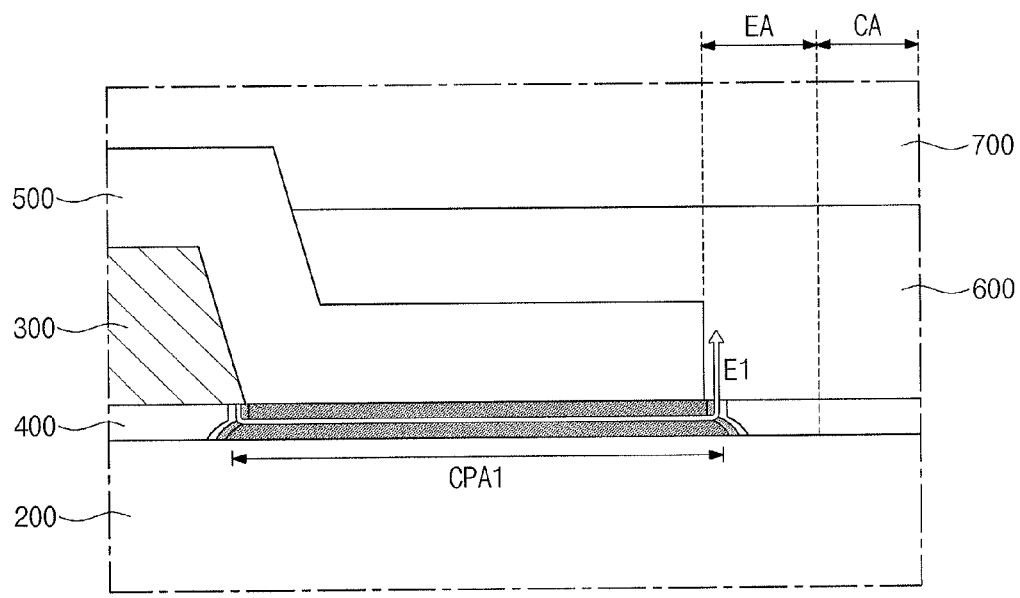
FIG. 3B illustrates a cross-sectional view showing a simulated result of the non-uniform mode.

FIG. 3A illustrates a cross-sectional view showing an operation of a non-uniform mode according to an exemplary embodiment, and FIG. 3B illustrates a cross-sectional view showing a simulated result of the non-uniform mode.

Referring to FIGS. 3A and 3B, in the non-uniform mode, the electric potential of the switching voltage V1 is higher than that of the threshold voltage Vth and the electric potential of the auxiliary voltage V2 is lower than that of the switching voltage V1.

Therefore, the channel is formed in the semiconductor layer 400 disposed in the second area A2, and thus the electrons from the source electrode 300 may reach the first transport area 600 when the driving voltage is applied to the source electrode 300 and the drain electrode 900.

However, since electrons, which are influenced by an electric field formed by an electric potential difference between the source electrode 300 and the drain electrode 900, may have a tendency to move through a shortest path among paths between the source electrode 300 and the drain electrode 900. The electrons may reach only a portion of the light emitting layer 700 corresponding to an edge area EA of the first area A1 and form a first electron current E1. The electrons from the source electrode 300 may not reach the light emitting layer 700 corresponding to a center area CA of the first area A1. The holes from the drain electrode 900 may be provided to the light emitting layer 700 corresponding to the edge area EA and may form a hole current HC. Thus, the electrons may recombine with the holes only in the portion of the light emitting layer 700 corresponding to the edge area EA. As a result, the light emission may occur only in portions of the light emitting layer 700 corresponding to the edge area EA and may not occur in the light emitting layer 700 corresponding to the center area CA.

As shown in FIG. 3B, the semiconductor layer 400 may include a plurality of areas. A contrast in each area indicates a current density of a corresponding area. A darker contrast in areas indicates a larger current density. As shown in FIG. 3, the current density may be concentrated in the semiconductor layer 400 corresponding to a first current path area CPA1.

Accordingly, the first electron current E1 may flow only through the first transport area 600 corresponding to the edge area EA and may not flow through the center area CA. For example, the first electron current E1 may flow intensively through the edge area EA adjacent to the second insulating layer 500.

Figure 4A:
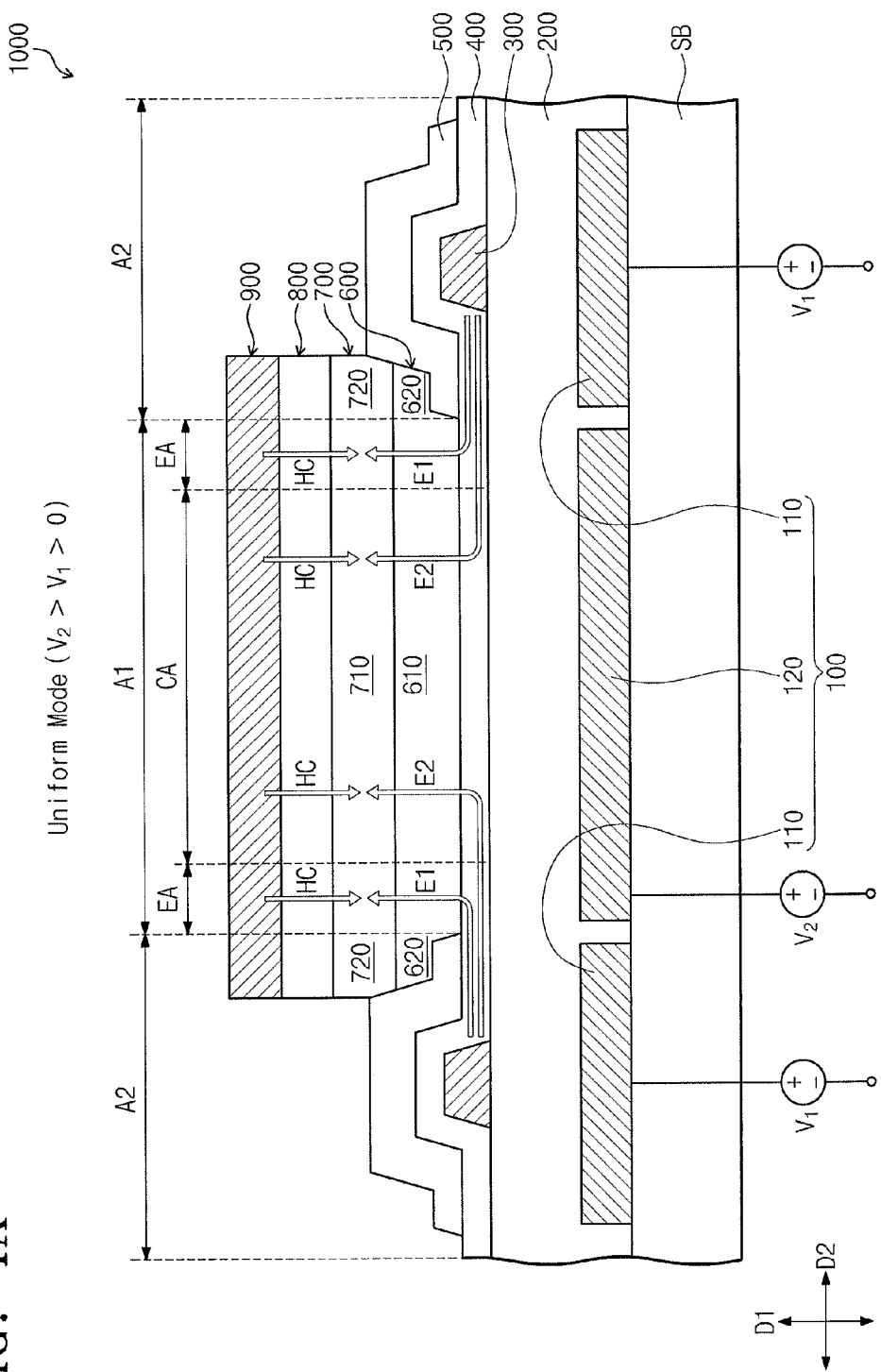
FIG. 4A illustrates a cross-sectional view showing an operation of a uniform mode according to an exemplary embodiment.
Figure 4B:
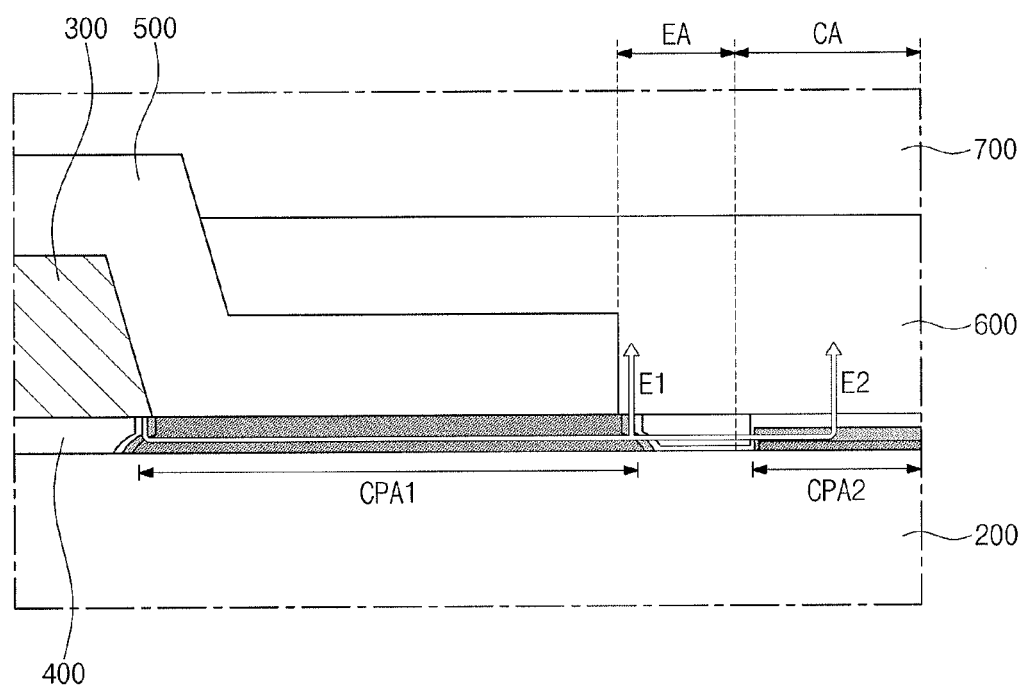
FIG. 4B illustrates a cross-sectional view showing a simulated result of the uniform mode.

FIG. 4A illustrates a cross-sectional view showing an operation of a uniform mode according to an exemplary embodiment and FIG. 4B illustrates a cross-sectional view showing a simulated result of the uniform mode.

Referring to FIGS. 4A and 4B, in the uniform mode, the electric potential of the switching voltage V1 is higher than that of the threshold voltage Vth and the electric potential of the auxiliary voltage V2 is higher than that of the switching voltage V1.

Therefore, the channel may be formed in the semiconductor layer 400 disposed in the second area A2, and electrons from the source electrode 300 may reach to the first transport area 600 when the driving voltage is applied to the source electrode 300 and the drain electrode 900.

A portion of the electrons from the source electrode 300 may reach the portion of the light emitting layer 700 corresponding to the edge area EA to form the first electron current E1. In addition, since the auxiliary voltage V2 is higher than the switching voltage V1, the other portion of the electrons from the source electrode 300 may reach the portion of the light emitting layer 700 corresponding to a center area CA through the first transport area 600 corresponding to the center area CA by the switching voltage V1 to form a second electron current E2. The holes from the drain electrode 900 may be provided to the light emitting layer 700 corresponding to the edge area EA and the center area CA to form the hole current HC.

Thus, the electrons may recombine with the holes in the portions of the light emitting layer 700 corresponding to the edge area EA and corresponding to the center area CA. Accordingly, light emission may occur on the entire surface of the light emitting layer 700 corresponding to the first area A1.

As shown in FIG. 4B, the large current density may be formed in the semiconductor layer 400 corresponding to the first current path area CPA1 and corresponding to a second current path area CPA2 defined in the center area CA.

For example, the current formed by the electrons from the source electrode 300 may flow not only through the portion of the first transport area 600 corresponding to the edge area EA (the first electron current E1) but also through the portion of first transport area 600 corresponding to the center area CA (the second electron current E2). As a result, the organic light emitting transistor 1000 may generate the light having uniform brightness over the first area A1.

Figure 5:
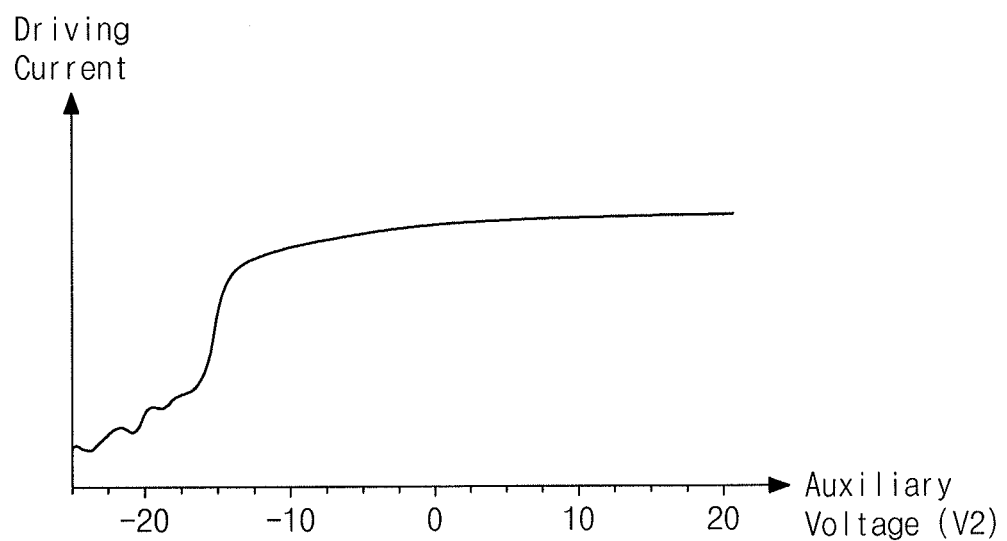
FIG. 5 illustrates a graph showing an I-V curve of an organic light emitting transistor according to an exemplary embodiment.

FIG. 5 is a graph showing an I-V curve of the organic light emitting transistor according to an exemplary embodiment.

In FIG. 5, an X-axis indicates the electric potential of the auxiliary voltage V2 and a Y-axis indicates the amount of the driving current flowing through the organic light emitting transistor 1000. The Y-axis is log scale. Referring to FIG. 5, as the electric potential of the auxiliary voltage V2 increases, the amount of the driving current increases. Accordingly, the driving current may be controlled in accordance with the electric potential of the auxiliary voltage V2. The brightness of the light generated by the organic light emitting transistor 1000 may be controlled by controlling the auxiliary voltage V2.

Figure 6:
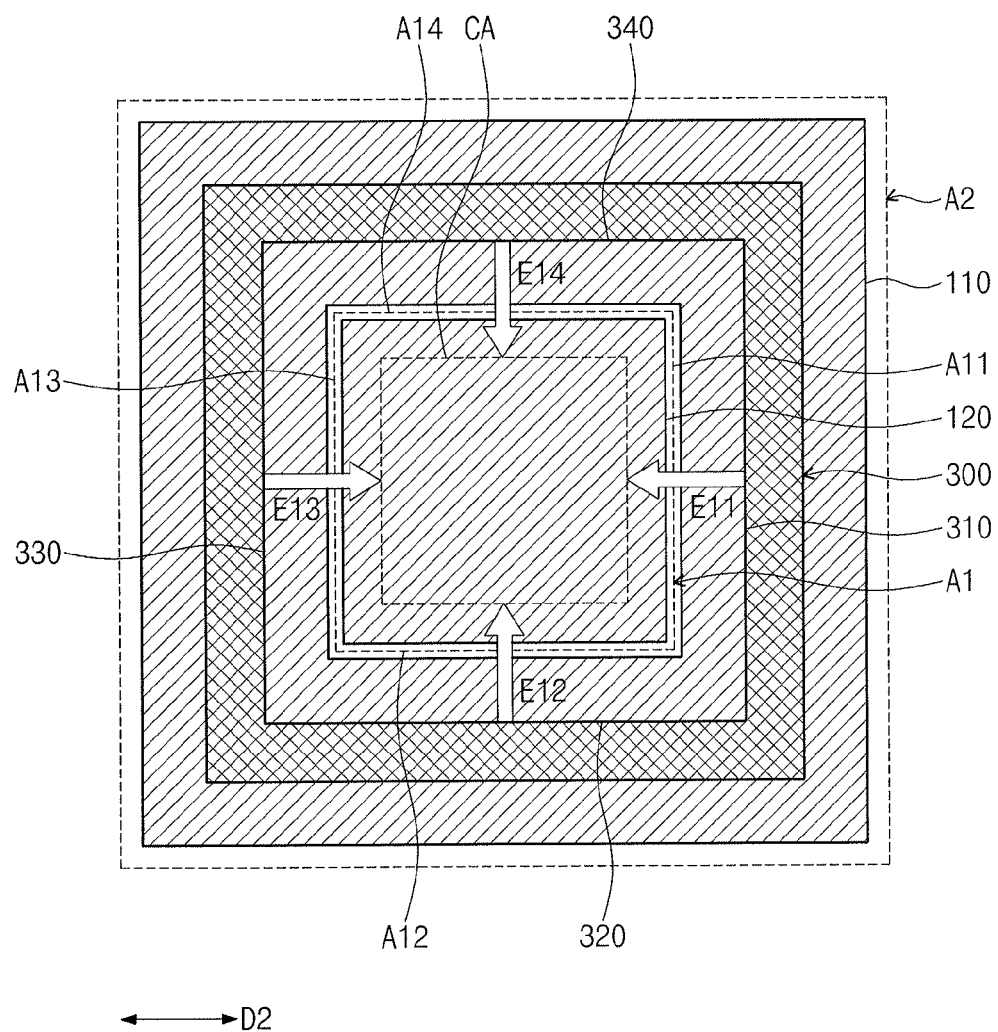
FIG. 6 illustrates a plan view showing a source electrode and a gate electrode according to an exemplary embodiment.

FIG. 6 illustrates a plan view showing a source electrode and a gate electrode according to an exemplary embodiment.

Referring to FIG. 6, the first area A1 may have a substantially quadrangular shape and the second area A2 may surround the first area A1. The auxiliary gate electrode 120 may have a substantially quadrangular shape in the first area A1.

The switching gate electrode 110 may be provided in the second area A2 and may have a substantially rectangular ring shape. The switching gate electrode 110 may surround the auxiliary gate electrode 120.

The source electrode 300 may be provided in the second area A2. For example, the source electrode 300 may be disposed on the switching gate electrode 110 to overlap with the switching gate electrode 110.

When the driving voltage is applied to the organic light emitting transistor 1000 in the uniform mode (refer to FIG. 4A), the current from the source electrode flows to the first area A1. For example, a current E11 from a first edge 310 of the source electrode 300 may flow to the center area CA of the first area A1 after passing through a first boundary A11 of the first area A1.

Similarly, current from second to fourth edges 320 to 340 of the source electrode 300 may flow to the center area CA of the first area A1 after respectively passing through second to fourth boundaries A13 to A14. Accordingly, the currents E12 to E14 may be uniformly provided to the first area A1 As a result, the brightness of the light generated by the organic light emitting transistor 1000 may be uniform in the first area A1.

Figure 7:
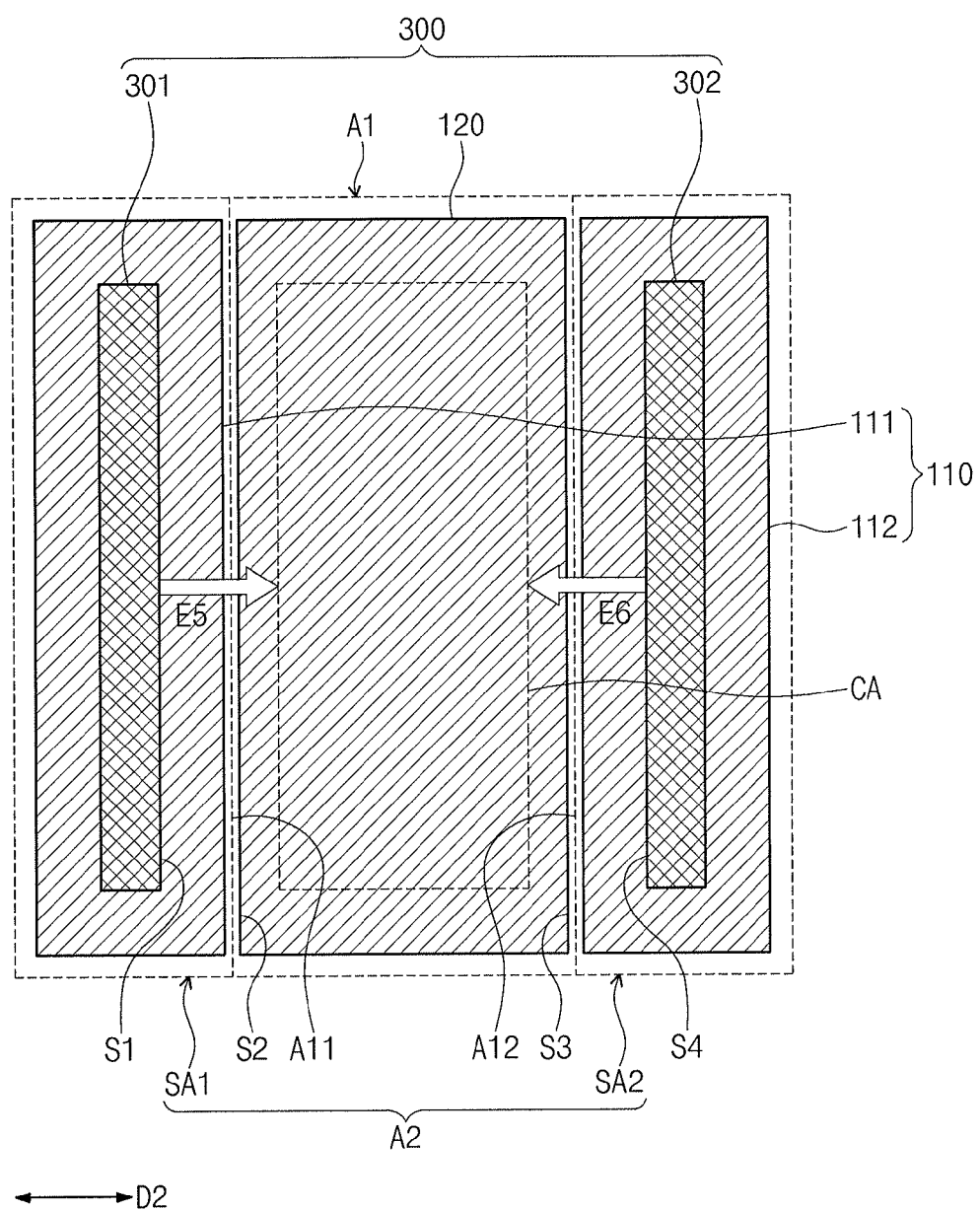
FIG. 7 illustrates a plan view showing a source electrode and a gate electrode according to another exemplary embodiment.

FIG. 7 is a plan view showing a source electrode and a gate electrode according to another exemplary embodiment.

Referring to FIG. 7, the first area A1 has a substantially quadrangular shape and the auxiliary gate electrode 120 may be provided in the first area A1 and may have a substantially quadrangular shape.

The second area A2 may include a first sub-area SA1 and a second sub-area SA2. The first and second sub-areas SA1 and SA2 may have a substantially quadrangular shape and may be spaced apart from each other in the second direction D2 such that the first area A1 is disposed between the first and second sub-areas SA1 and SA2.

The switching gate electrode 110 may include a first sub-switching gate electrode 111 and a second sub-switching gate electrode 112. The first and second sub-switching gate electrodes 111 and 112 may be provided to respectively correspond to the first and second sub-areas SA1 and SA2.

The first sub-switching gate electrode 111 may have a substantially rectangular shape. A first side S1 of the first sub-switching gate electrode 111 may be substantially parallel to a second side S2 of the auxiliary gate electrode 120. The first side S1 may correspond in length and placement to one side of the four sides of the first sub-switching gate electrode 111 that is adjacent to the auxiliary gate electrode 120. The second side S2 may correspond to the side of the auxiliary gate electrode 120 that is adjacent to the first sub-switching gate electrode 111.

The second sub-switching gate electrode 112 may have a substantially rectangular shape. A third side S3 of the second sub-switching gate electrode 112 is substantially parallel to a fourth side S4 of the auxiliary gate electrode 120. The third side S3 may correspond in length and placement to one side of the four sides of the second sub-switching gate electrode 112 that is adjacent to the auxiliary gate electrode 120. The fourth side S4 may correspond to a the side of the auxiliary gate electrode 120 that is adjacent to the second sub-switching gate electrode 112.

The source electrode 300 may include a first sub-source electrode 301 and a second sub-source electrode 302. The first sub-source electrode 301 may be provided in the first sub-area SA1. For example, the first sub-source electrode 301 may have a shape corresponding to that of the first sub-switching gate electrode 111 and may be in an overlapping relationship with the first sub-switching gate electrode 111.

The second sub-source electrode 302 may be disposed in the second sub-area SA2. For example, the second sub-source electrode 302 may have a shape corresponding to that of the second sub-switching gate electrode 112 and may be in an overlapping relationship with the second sub-switching gate electrode 112.

When the driving voltage is applied to the organic light emitting transistor 1000 in the uniform mode (refer to FIG. 4A), the current from the first sub-source electrode 301 may flow to the first area A1. For example, the current E5 provided from the first edge 310 of the first sub-source electrode 301 may flow to the center area CA of the first area A1 after passing through the first boundary A11 of the first area A1.

Similarly, the current E6 provided from the second edge 320 of the second sub-source electrode 302 may flow to the center area CA of the first area A1 after passing through the second boundary A12 of the first area A1. The current may be uniformly provided to the entire surface of the first area A1. The brightness of the organic light emitting transistor 1000 is uniform in the first area A1.

Figure 8:
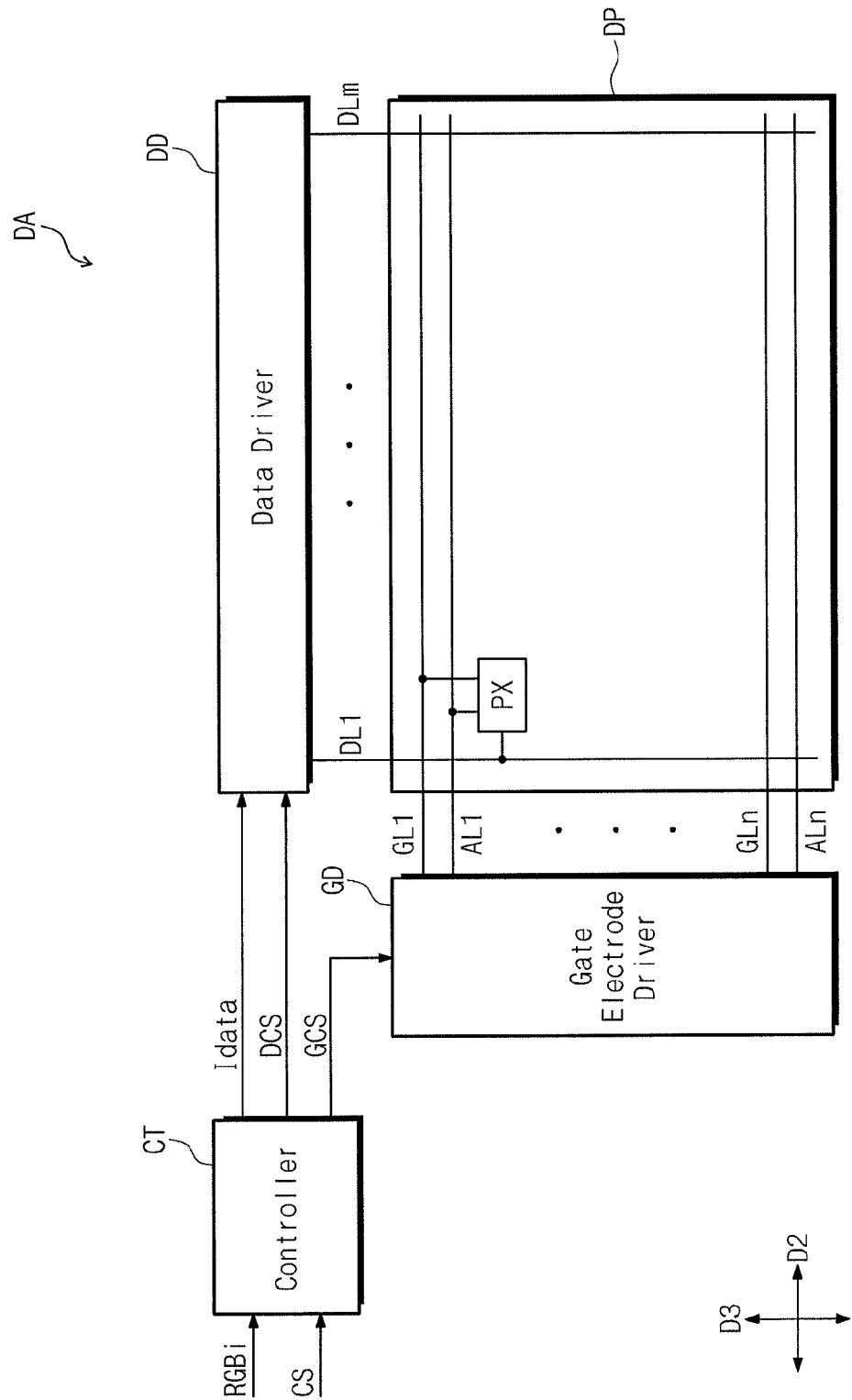
FIG. 8 illustrates a block diagram showing a display device according to an exemplary embodiment.

FIG. 8 illustrates a block diagram showing a display device DA according to an exemplary embodiment.

Referring to FIG. 8, the display device DA may include a display panel DP to display an image, a gate electrode driver GD and a data driver DD to drive the display panel DP, and a controller CT to control the gate electrode driver GD and the data driver DD.

The controller CT may receive input image information RGBi and a plurality of control signals CS from the outside of the display device DA. The controller CT may convert a data format of the input image information RGBi to a data format appropriate to an interface between the data driver DD and the controller to generate output image data IDATA and may apply the output image data IDATA to the data driver DD.

The controller CT may generate a data control signal DCS, e.g., an output start signal, a horizontal start signal, etc., on the basis of the control signals CS and a gate electrode control signal GCS, e.g., a vertical start signal, a vertical clock signal, a vertical clock bar signal, etc. The data control signal DCS may be applied to the data driver DD, and the gate electrode control signal GCS may be applied to the gate electrode driver GD.

The gate electrode driver GD may sequentially output gate electrode signals and auxiliary signals in response to the gate electrode control signal GCS provided from the controller CT.

The data driver DD may convert the output image data IDATA into data voltages in response to the data control signal DCS provided from the controller CT and may apply the data voltages to the display panel DP.

The display panel DP may include a plurality of gate electrode line GL1 to GLn, a plurality of auxiliary lines AL1 to ALn, a plurality of data lines DL1 to DLm, and a plurality of pixels PX.

The display panel DP may have a resolution determined by the number of the pixels PX arranged on the display panel DP. For the convenience of explanation, FIG. 8 shows only one pixel PX.

Each pixel may display one of primary colors of red, green, blue, and white colors, as examples. In other implementations, the primary colors may further include various colors, e.g., yellow, cyan, magenta, etc.

The gate electrode lines GL1 to GLn may extend in a second direction D2 and may be arranged to be parallel to each other in a third direction D3 substantially perpendicular to the second direction D2. The gate electrode lines GL1 to GLn may be connected to the gate electrode driver GD to sequentially receive the gate electrode signals from the gate electrode driver GD.

In addition, the auxiliary lines AL1 to ALn may extend in the second direction D2 and may be arranged in the third direction D3 to be substantially parallel to each other. The auxiliary lines AL1 to ALn may be connected to the gate electrode driver GD to sequentially receive the auxiliary signals from the gate electrode driver GD.

The data lines DL1 to DLm may extend in the third direction D3 and may be arranged in the second direction D2 to be substantially parallel to each other. The data lines DL1 to DLm may be connected to the data driver DD to receive the data voltages from the data driver DD.

Each of the pixels PX may be connected to a corresponding gate electrode line of the gate electrode lines GL1 to GLn, a corresponding auxiliary line of the auxiliary lines AL1 to ALn, and a corresponding data line of the data lines DL1 to DLm.

As an example, each pixel may include the organic light emitting transistor 1000 shown in FIG. 1. The switching gate electrode 110 of each pixel PX is connected to the corresponding gate electrode line to receive the gate electrode signal from the gate electrode line connected thereto.

The auxiliary gate electrode 120 of each pixel PX may be connected to the corresponding auxiliary line to receive the auxiliary signal from the auxiliary line connected thereto. The auxiliary signal may include the above-mentioned auxiliary voltage V2 (refer to FIGS. 2 to 4).

The pixels PX may be turned on or turned off in response to the gate electrode signal applied thereto. The turned-on pixel PX may display a grayscale level corresponding to the data voltage applied thereto.

The organic light emitting transistor 1000 of the pixels PX may be operated in the non-uniform mode or the uniform mode in response to the auxiliary signal applied thereto. The brightness of the image displayed in the organic light emitting transistor 1000 of the pixels PX may be controlled by the auxiliary signal as described with reference to FIG. 5.

The controller CT may be mounted on the printed circuit board in an integrated circuit chip form and connected to the gate electrode driver GD and the data driver DD. The gate electrode driver GD and the data driver DD may be mounted on a flexible printed circuit board after being formed as plural driving chips, and then connected to the display panel DP in a tape carrier package (TCP) scheme.

In some implementations, the gate electrode driver GD and the data driver DD may be mounted on the display panel DP in a chip on glass (COG) arrangement after being formed as plural driving chips. In addition, the gate electrode driver GD may be substantially simultaneously formed with the transistors of the pixels PX and mounted on the display panel DP in ASG (amorphous silicon TFT gate driver circuit) form.

Figure 9:
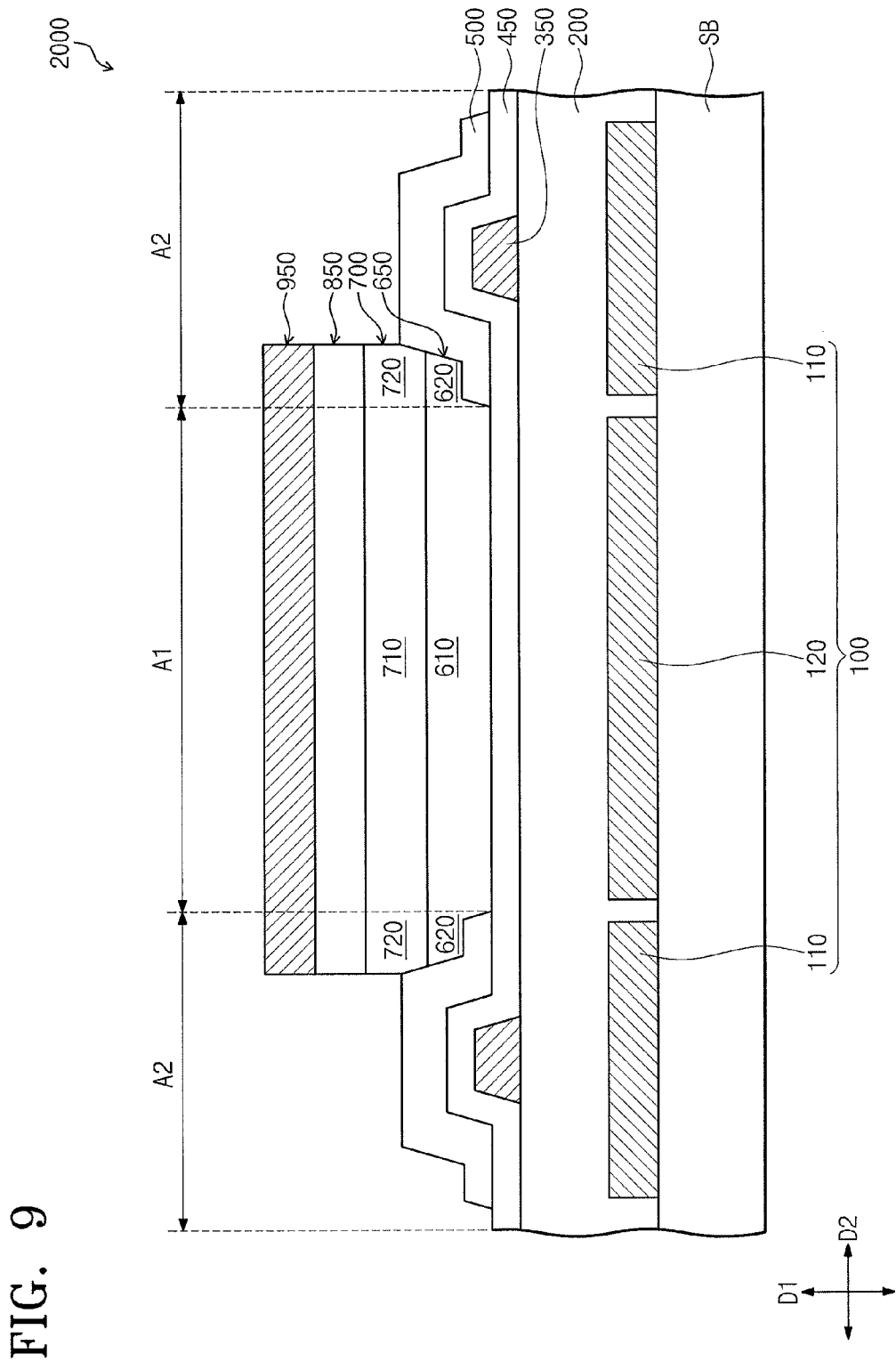
FIG. 9 illustrates a cross-sectional view showing an organic light emitting transistor according to another exemplary embodiment.

FIG. 9 illustrates a cross-sectional view showing an organic light emitting transistor 2000 according to another exemplary embodiment.

A semiconductor layer 450 of the organic light emitting transistor 2000 shown in FIG. 9 may include a p-type semiconductor material. Features of the organic light emitting transistor 2000 may have similar structure and function as those of the organic light emitting transistor 1000 shown in FIG. 1, except that a first transport area 650 may be the hole transport area, a second transport area 850 may be the electron transport area, and the source and drain electrodes 350 and 950 may be positive and negative electrodes, respectively. Accordingly, different features of the organic light emitting transistor 2000 from the organic light emitting transistor 1000 shown in FIG. 1 will be described in detail.

FIG. 10 illustrates a cross-sectional view showing a non-uniform mode of the organic light emitting transistor 2000 shown in FIG. 9.

Referring to FIG. 10, in the non-uniform mode, the electric potential of the switching voltage V1 is lower than the electric potential of the threshold voltage Vth of the semiconductor layer 450 and the electric potential of the auxiliary voltage V2 is higher than the electric potential of the switching voltage V1.

The channel is formed in the semiconductor layer 450 disposed in the second area A2. Accordingly the holes from the source electrode 350 reach the first transport area 650 when the driving voltage is applied to the source electrode 350 and the drain electrode 950. The holes drifted by the electric field may move through the shortest path. Accordingly, the holes may reach only the portion of the light emitting layer 700 corresponding to the edge area EA of the first area A1 and form a first hole current H1. In addition, the holes from the source electrode 350 may not reach the portion of the light emitting layer 700 corresponding to the center area CA of the first area A1. The electrons from the drain electrode 950 may be provided to the portion of the light emitting layer 700 corresponding to the edge area EA to form the electron current EC. Thus, the electrons may be recombined with the holes only in the portion of the light emitting layer 700 corresponding to the edge area EA. As a result, light emission may occur only in the portion of the light emitting layer 700 corresponding to the edge area EA and may not occur in the portion of the light emitting layer 700 corresponding to the center area CA.

FIG. 11 illustrates a cross-sectional view showing an operation of a uniform mode of the organic light emitting transistor 2000 shown in FIG. 9.

Referring to FIG. 11, in the uniform mode, the electric potential of the switching voltage V1 is lower than the electric potential of the threshold voltage Vth and the electric potential of the auxiliary voltage V2 is higher than the electric potential of the switching voltage V1.

The channel may be formed in the semiconductor layer 450 disposed in the second area A2. Accordingly, the holes from the source electrode 350 may reach the first transport area 650 when the driving voltage is applied to the source electrode 350 and the drain electrode 950.

A portion of the holes from the source electrode 350 may reach the portion of the light emitting layer 700 corresponding to the edge area EA and may form the first hole current H1. Since the auxiliary voltage V2 is lower than the switching voltage V1, the other portion of the holes from the source electrode 350 may reach to the portion of the light emitting layer 700 corresponding to the center area CA through the portion of the first transport area 650 corresponding to the center area CA by the switching voltage V1 to form a second hole current H2. The electrons from the drain electrode 950 may be provided to the portion of the light emitting layer 700 corresponding to the edge area EA and the center area CA to form the electron current EC.

The electrons may recombine with the holes in the light emitting layer 700 corresponding to the edge area EA and the center area CA, and light emission may occur on the entire surface of the light emitting layer 700 corresponding to the first area A1.

By way of summation and review, the organic light emitting transistor includes an auxiliary gate electrode and a switching gate electrode. Thus the organic light emitting transistor emits the light having uniform brightness.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. An organic light emitting transistor, comprising:
a substrate;
a first insulating layer on the substrate;
an auxiliary gate electrode between the substrate and the first insulating layer, the auxiliary gate electrode corresponding to a first area;
a switching gate electrode between the substrate and the first insulating layer, the switching gate electrode corresponding to a second area defined adjacent to at least one side of the first area, the switching gate electrode being insulated from the auxiliary gate electrode;
a source electrode on the first insulating layer, the source electrode corresponding to the second area;
a semiconductor layer on the first insulating layer, the semiconductor layer corresponding to at least the first area and the semiconductor layer being connected to the source electrode;
a drain electrode corresponding to at least the first area; and
a light emitting layer between the drain electrode and the semiconductor layer.

2. The organic light emitting transistor as claimed in claim 1, further comprising a second insulating layer, wherein:
the light emitting layer includes a first portion corresponding to the first area and a second portion extending from the first portion and corresponding to the second area, and
the second insulating layer is between the second portion and the source electrode, the second insulating layer corresponding to the second area and insulating the first portion from the source electrode.

3. The organic light emitting transistor as claimed in claim 2, wherein:
the second area surrounds the first area, and
the switching gate electrode surrounds the auxiliary gate electrode.

4. The organic light emitting transistor as claimed in claim 2, wherein:
the second area includes a first sub-area and a second sub-area that are spaced apart from each other in a direction substantially vertical to a thickness direction of the substrate,
the switching gate electrode includes a first sub-switching gate electrode provided in the first sub-area and a second sub-switching gate electrode provided in the second sub-area,
the first area is between the first and second sub-areas, and
the auxiliary gate electrode is between the first and second sub-switching gate electrodes.

5. The organic light emitting transistor as claimed in claim 1, wherein the source electrode is spaced apart from the first area by a distance along a direction substantially vertical to a thickness direction of the substrate.

6. The organic light emitting transistor as claimed in claim 5, wherein the distance is in a range from about 0.5 micrometers to about 10 micrometers.

7. The organic light emitting transistor as claimed in claim 2, wherein:
the semiconductor layer includes an n-type semiconductor material, an electron transport area is between the semiconductor layer and the light emitting layer, and
a hole transport area is between the semiconductor layer and the drain electrode.

8. The organic light emitting transistor as claimed in claim 2, wherein:
the semiconductor layer includes a p-type semiconductor material, a hole transport area is between the semiconductor layer and the light emitting layer, and
an electron transport area is between the semiconductor layer and the drain electrode.

9. A display device, comprising:
an organic light emitting transistor; and
a driver controlling the organic light emitting transistor, the organic light emitting transistor comprising:

a substrate;

a first insulating layer on the substrate;

an auxiliary gate electrode between the substrate and the first insulating layer, the auxiliary gate corresponding to a first area;

a switching gate electrode between the substrate and the first insulating layer, the switching gate corresponding to a second area defined adjacent to at least one side of the first area and the switching gate electrode being insulated from the auxiliary gate electrode;

a source electrode on the first insulating layer, the source electrode corresponding to the second area;

a semiconductor layer on the first insulating layer, the semiconductor layer corresponding to at least the first area and the semiconductor layer being connected to the source electrode;

a drain electrode corresponding to at least the first area; and a light emitting layer between the drain electrode and the semiconductor layer, wherein the driver applies an auxiliary voltage to the auxiliary gate electrode and applies a switching voltage different from the auxiliary voltage to the switching gate electrode to minimize a difference in brightness between a first light generated in a center portion of the first area and a second light generated in an edge portion of the first area.

10. The display device as claimed in claim 9, wherein the auxiliary voltage has an electric potential higher than an electric potential of the switching voltage.

11. The display device as claimed in claim 10, wherein the semiconductor layer includes an n-type semiconductor material.

12. The display device as claimed in claim 11, wherein:
an electron transport area is between the semiconductor layer and the light emitting layer, and
a hole transport area is between the semiconductor layer and the drain electrode.

13. The display device as claimed in claim 9, wherein the auxiliary voltage has an electric potential lower than an electric potential of the switching voltage.

14. The display device as claimed in claim 13, wherein the semiconductor layer includes an p-type semiconductor material.

15. The display device as claimed in claim 14, wherein:
a hole transport area is between the semiconductor layer and the light emitting layer, and
an electron transport area is between the semiconductor layer and the drain electrode.

* * * * *